United States Patent [19]

Yamamoto

[11] Patent Number: 5,777,851
[45] Date of Patent: Jul. 7, 1998

[54] CIRCUIT BOARD HAVING A WIRING STRUCTURE BURIED IN A RESIN LAYER

[75] Inventor: Osamu Yamamoto, Mie-ken, Japan

[73] Assignee: Kabushiki Kaisha Toshiba, Kawasaki, Japan

[21] Appl. No.: 582,285

[22] Filed: Jan. 3, 1996

[30] Foreign Application Priority Data

Jan. 13, 1995 [JP] Japan ................................ 7-004228

[51] Int. Cl.⁶ .......................... H05K 1/11; H05K 1/16
[52] U.S. Cl. .......................... 361/748; 174/251; 174/255; 361/760; 361/761; 361/774; 361/777; 361/779; 361/813
[58] Field of Search .......................... 174/250, 72 B, 174/251, 72 C, 253, 71 B, 255, 260, 261, 262, 267; 257/666, 667, 668, 678, 690, 693, 700; 361/728, 748, 760, 761, 763, 764, 772, 774, 775, 777, 779, 782, 783, 807, 809, 813, 822, 823, 826; 439/54, 55, 56, 884, 949, 76.2

[56] References Cited

U.S. PATENT DOCUMENTS

| | | | |
|---|---|---|---|
| 1,803,017 | 4/1931 | Herschmann | 361/813 |
| 3,038,105 | 6/1962 | Brownfield | 361/748 |
| 3,216,089 | 11/1965 | Dettman | 361/813 |
| 3,388,464 | 6/1968 | Pretty | 361/813 |
| 3,898,535 | 8/1975 | Ebbert | 174/251 |
| 3,978,375 | 8/1976 | Fukui et al. | 174/251 |
| 4,600,971 | 7/1986 | Rose et al. | 361/813 |
| 5,599,201 | 2/1997 | Sommer et al. | 439/949 |

FOREIGN PATENT DOCUMENTS

| | | | |
|---|---|---|---|
| 1-282894 | 11/1989 | Japan . | |
| 3-1598 | 1/1991 | Japan | 361/748 |
| 4-69995 | 3/1992 | Japan . | |

*Primary Examiner*—Donald Sparks
*Attorney, Agent, or Firm*—Oblon, Spivak, McClelland, Maier, & Neustadt, P.C.

[57] ABSTRACT

A circuit board including a resin layer and a wiring structure buried in the resin layer for forming an electric circuit. In the circuit board, the wiring structure is provided with a connecting part for soldering a first electrical part. The wiring structure is provided with a connecting hole for connecting a second electrical part by inserting a fastening member, and the connecting part is positioned on a surface of the resin layer.

18 Claims, 11 Drawing Sheets

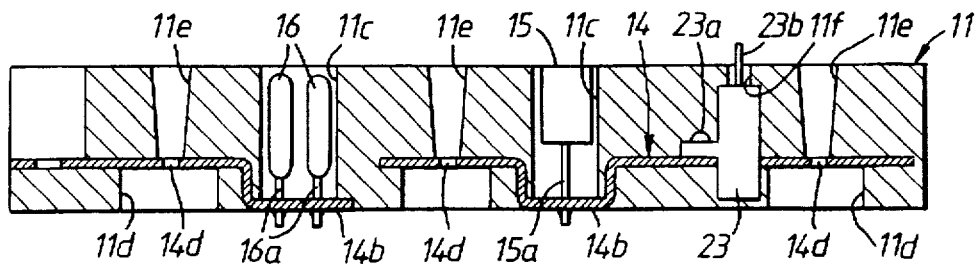
Fig.6
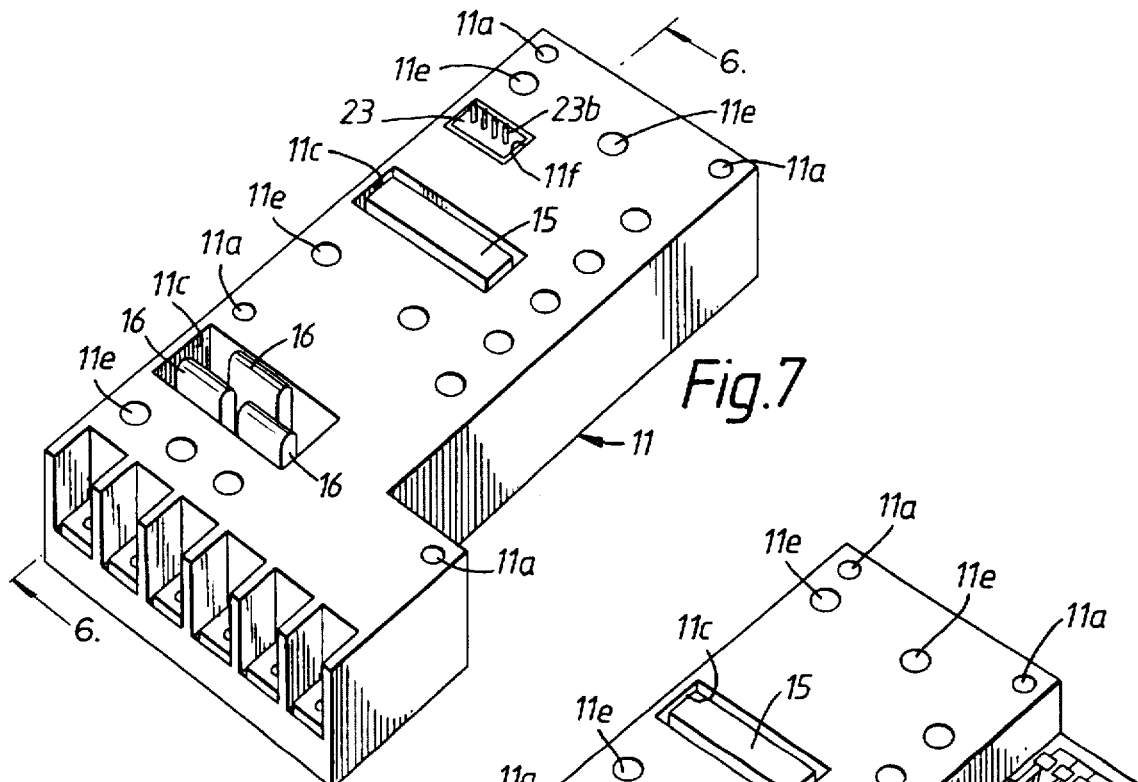
Fig.7
Fig.8

CIRCUIT BOARD HAVING A WIRING STRUCTURE BURIED IN A RESIN LAYER

BACKGROUND OF THE INVENTION

1. Field of the Invention

This invention relates to a circuit board and a circuit board assembly, and more particularly to a circuit board with a composition in which a wiring structure forming an electric circuit is covered by a resin layer and a circuit board assembly with a composition in which electrical parts and so on are mounted on the circuit board.

2. Description of the Related Art

A printed wiring board has a composition in which circuit patterns of thickness 35μ or 75μ made of electrolytic copper foil are formed on one side or both sides of a laminated insulating board (thickness 1 mm–3 mm). Therefore, there are the problems that there are limits to the capacity of the current which can be passed in the circuit patterns, and that jumper wires are required at the solid crossing parts of the wiring. A circuit board proposed for solving the above problems has been disclosed in "Japanese Patent Application No. Heisei 6-159119 Gazette".

As shown in FIG. 23, this circuit board has a composition in which a wiring structure 1 which forms the circuit patterns is covered by a resin layer 2. As shown in FIG. 24, wiring structure 1 has a configuration in which multiple wiring members 1a are assembled three-dimensionally. In the case of this composition, hole-shaped connecting parts 1b or lead units 1c are formed in wiring members 1a. When connecting small electrical parts to wiring structure 1, the terminals of the electrical parts are soldered to connecting parts 1b. Also, when connecting large electrical parts to wiring structure 1, the terminals of the electrical parts are inserted in lead units 1c for soldering.

However, with the above prior art composition, the height positions of connecting parts 1b are not uniform. Thus, the soldering work of small electrical parts cannot be carried out by using a printed wiring board solder bath facility. Therefore, it was necessary to solder the small electrical parts to connecting parts 1b one by one, either manually or by robots. Consequently, the workability of connecting the small electrical parts was poor. Moreover, after inserting the large electrical parts on lead units 1c, the soldering work was performed by turning the circuit board and the electrical parts upside down. As a result, the workability of connecting these electrical parts was even poorer.

SUMMARY OF THE INVENTION

Accordingly, one object of this invention is to provide a circuit board in which the workability of connecting electrical parts can be improved.

Another object of this invention is to provide a circuit board assembly in which the workability of connecting electrical parts can be improved.

These and other objects of this invention can be achieved by providing a circuit board including a resin layer and a wiring structure buried in the resin layer for forming an electric circuit. In the circuit board, the wiring structure is provided with a connecting part for soldering a first electrical part. The wiring structure is provided with a connecting hole for connecting a second electrical part by inserting a fastening member, and the connecting part is positioned on a surface of the resin layer.

According to one aspect of this invention, there can be achieved by providing a circuit board assembly including a resing layer and a wiring structure buried in the resin layer composed of a plurality of wiring members assembled three-dimensionally for forming an electric circuit. The circuit board assembly further includes a plurality of first electrical parts, a plurality of second electrical parts, and a plurality of fastening members. The wiring structure is provided with a plurality of connecting parts formed in the wiring members. Each of the first electrical parts is soldered to one of the connecting parts, respectively. The wiring structure is provided with a plurality of connecting holes formed in the wiring members. Each of the second electrical parts is connected to one of the wiring members by inserting one of the fastening member in one of the connecting holes, respectively. The connecting parts are positioned on a surface of the resin layer.

According to another aspect of this invention, there can be achieved by providing a circuit board assembly including a resing layer and a wiring structure buried in the resin layer composed of a plurality of wiring members assembled three-dimensionally for forming an electric circuit. The circuit board assembly further includes a plurality of first electrical parts, a second electrical part, and a plurality of fastening members. The wiring structure is provided with a plurality of connecting parts formed in the wiring members. Each of the first electrical parts is soldered to one of the connecting parts, respectively. The wiring structure is provided with a plurality of connecting holes formed in the wiring members. The second electrical part is connected to one of the wiring members by inserting one of the fastening members in one of the connecting holes, respectively. The connecting parts are positioned on a surface of the resin layer and the connecting holes are arranged on a surface part of the resin layer.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein:

FIG. 6 is a cross-section of a fourth embodiment of this invention along the line A—A in FIG. 7;

FIG. 7 is an oblique view showing a fourth embodiment of this invention;

FIG. 8 is an oblique view showing a fifth embodiment of this invention;

DETAILED DESCRIPTION OF THE PREFERRED EMBODIMENTS

Figure 1:
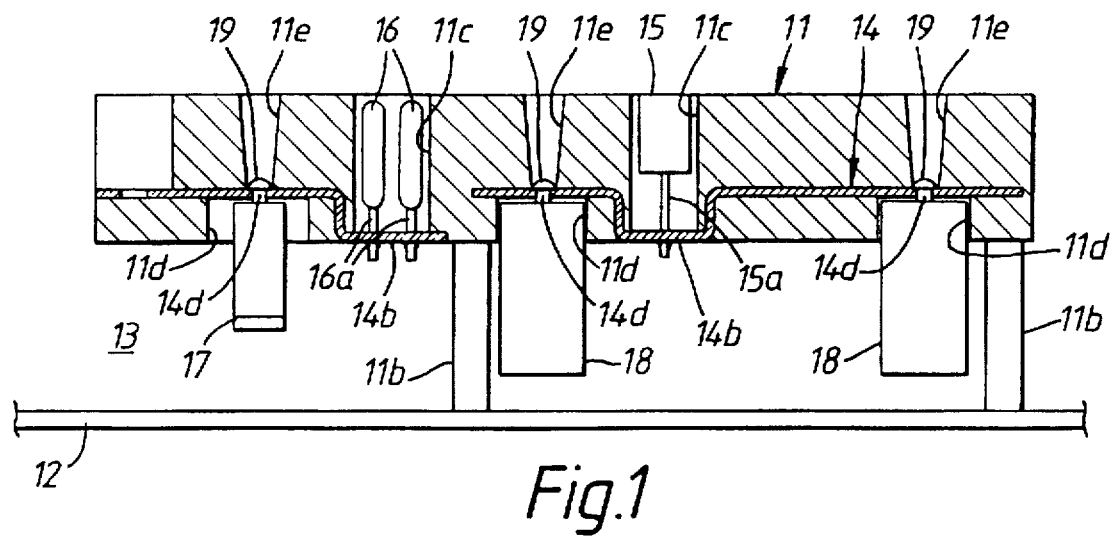
FIG. 1 is a cross-section of a first embodiment of this invention along the line A—A in FIG. 2.

Referring now to the drawings, wherein like reference numerals designate identical or corresponding parts throughout the several views, the embodiments of this invention will be described below.

Figure 2:
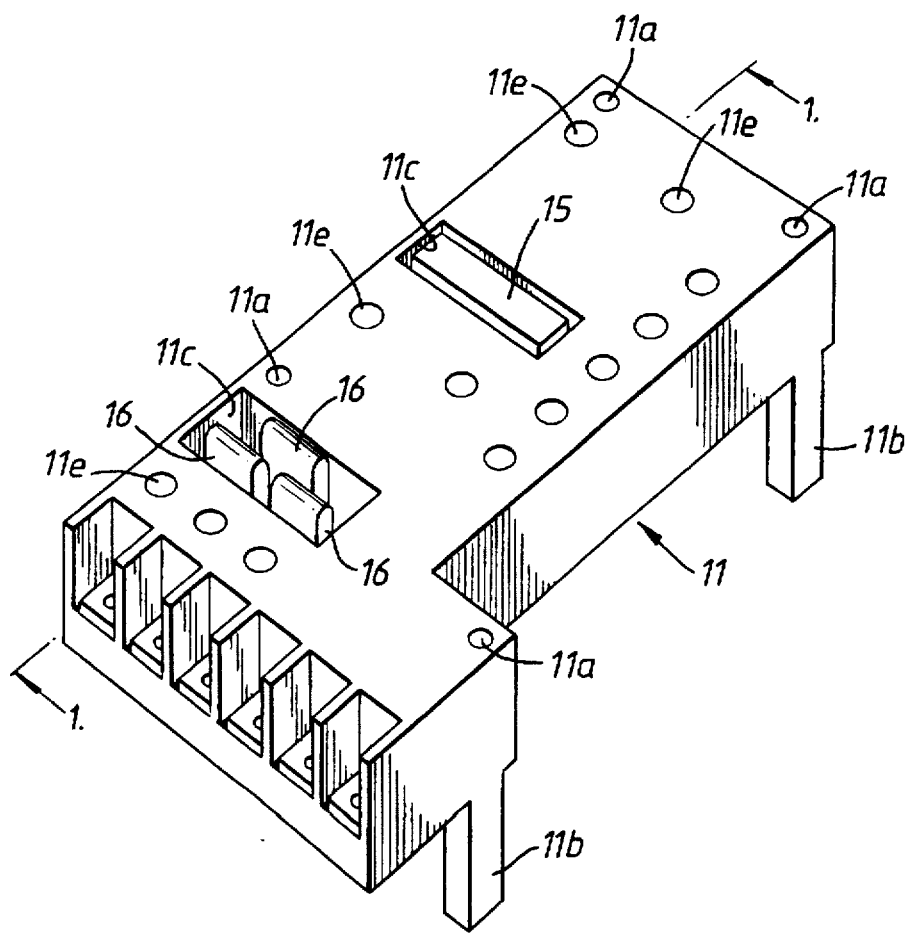
FIG. 2 is an oblique view showing a first embodiment of this invention.
Figure 3:
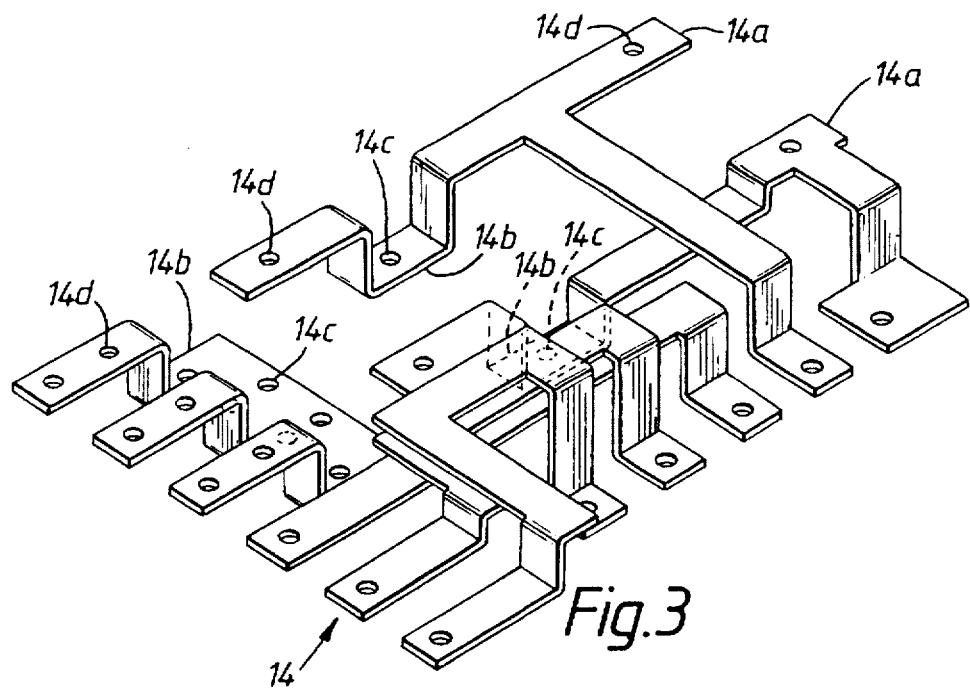
FIG. 3 is an oblique view showing a wiring structure shown in FIG. 2.

The following is a description of a first embodiment of this invention, based on FIGS. 1 to 3. In FIG. 2, first, four tapped holes 11a are formed in a molded body 11, which is equivalent to a "resin layer", and screws (not illustrated) are inserted in respective tapped holes 11a. Then, as shown in FIG. 1, molded body 11 is secured to a device main body 12, such as a main body of an inverter device, by tightening screws into device main body 12. Also, four supporting legs 11b (only two are shown) are incorporated with the underside of molded body 11. A space part 13 is formed between four supporting legs 11b and device main body 12.

A wiring structure 14 which forms the electric circuit is buried inside molded body 11. This wiring structure 14 is manufactured by cutting and bending a conductive metal plate and, as shown in FIG. 3, has a configuration in which multiple wiring members 14a are assembled three-dimensionally. Then, connecting parts 14b, which protrude downward, are formed in specified wiring members 14a respectively. As shown in FIG. 1, these connecting parts 14b are arranged along the underside of molded body 11. By this means, they are exposed on the underside of molded body 11.

As shown in FIG. 3, first connecting holes 14c are formed in each connecting part 14b of wiring structure 14. These first connecting holes 14c are formed by carrying out a punching process on wiring structure 14, and are arranged in connecting parts 14b along the underside of molded body 11. Also, as shown in FIG. 2, two openings 11c are formed in molded body 11. As shown in FIG. 1, connecting parts 14b of wiring structure 14 are exposed on the upper surface of molded body 11 by passing through openings 11c. Also, comparatively small electrical parts, such as a resistor 15 and small capacity capacitors 16 are provided, and terminals 15a of resistor 15 and terminals 16a of small capacity capacitors 16 are soldered to first connecting holes 14c of connecting parts 14b through openings 11c.

Here, molded body 11 is manufactured by insert molding processing, in which resin is injected in wiring structure 14 in a state in which wiring structure 14 is housed in a mold (not illustrated). The material used for molded body 11 is a thermoplastic resin which can sufficiently withstand the heat when resistor 15 and capacitors 16 are soldered. As the functions of molded body 11, the ensuring of the insulation distances of electrical parts which are connected to wiring structure 14, and the protection from vibration, etc. of the connecting parts between the electrical parts and wiring structure 14 can be cited.

Second connecting holes 14d which are equivalent to "connecting holes" are formed in wiring structure 14. These second connecting holes 14d are formed in wiring structure 14 by carrying out a punching process, and are arranged in the same horizontal plane which is above the plane of formation of connecting parts 14b. Also, multiple openings 11d are formed in the underside of molded body 11. Second connecting holes 14d are exposed on the underside of molded body 11 through openings 11d. Then, comparatively large electrical parts, such as a rectifier 17 and large capacity capacitors 18, are inserted into openings 11d of molded body 11.

As shown in FIG. 2, multiple circular openings 11e are formed in the upper surface of molded body 11. As shown in FIG. 1, second connecting holes 14d of wiring structure 14 are exposed on the upper side of molded body 11 through openings 11e. Then, screws 19 which is equivalent to "fastening members" are tightened into rectifier 17 and capacitors 18 through second connecting holes 14d of wiring structure 14 from openings 11e of molded body 11. By this means, rectifier 17 and capacitors 18 are connected to wiring structure 14.

The following is a description of the manufacturing order of the above circuit board. First, after wiring structure 14 is housed in a cavity of a mold, molded body 11 is formed by injecting molten resin into the cavity. Next, terminal 15a of resistor 15 and terminals 16a of capacitors 16 are inserted in first connecting holes 14c of wiring structure 14 through openings 11c of molded body 11. Then a simultaneous soldering process is automatically performed using a solder bath facility for printed wiring boards.

When resistor 15 and capacitors 16 have been connected, rectifier 17 and capacitors 18 are inserted in openings 11d of molded body 11. Then, screws 19 are automatically tightened in rectifier 17 and capacitors 18 through second connecting holes 14d of wiring structure 14 from openings 11e of molded body 11. After connecting rectifier 17 and capacitors 18 to wiring structure 14, screws (not shown) are inserted in tapped holes 11a of molded body 11. These screws are tightened into device main body 12.

When using the above embodiment, a composition was used of arranging multiple connecting parts 14b on the underside (the surface) of molded body 11 and soldering resistor 15 and capacitors 16 to these connecting parts 14b. For this reason, it is possible to perform automatic simultaneous soldering work using the facility of a solder bath for printed wiring boards. Therefore, the inefficient work of soldering small electrical parts one by one using manual work or robots is eliminated. As a result, the workability of connecting small electrical parts is improved.

Also in this embodiment, a composition was used of forming second connecting holes 14d in wiring structure 14 and automatically tightening screws 19 in rectifier 17 and capacitors 18 through second connecting holes 14d. For this reason, as opposed to prior art in which soldering was performed by inserting the large electrical parts into lead units, automatic connection work is possible for large electrical parts, such as rectifier 17 and capacitors 18. Therefore, coupled with the automatic soldering work for small electrical parts, such as resistor 15 and capacitors 16, the connecting work for large electrical parts can be fully automated. Thus, the workability of connecting electrical parts is further improved. Also, as multiple connecting holes 14d are arranged in the same horizontal plane, there is also the advantage that the automatic tightening work for screws 19 becomes simpler to perform.

Figure 4:
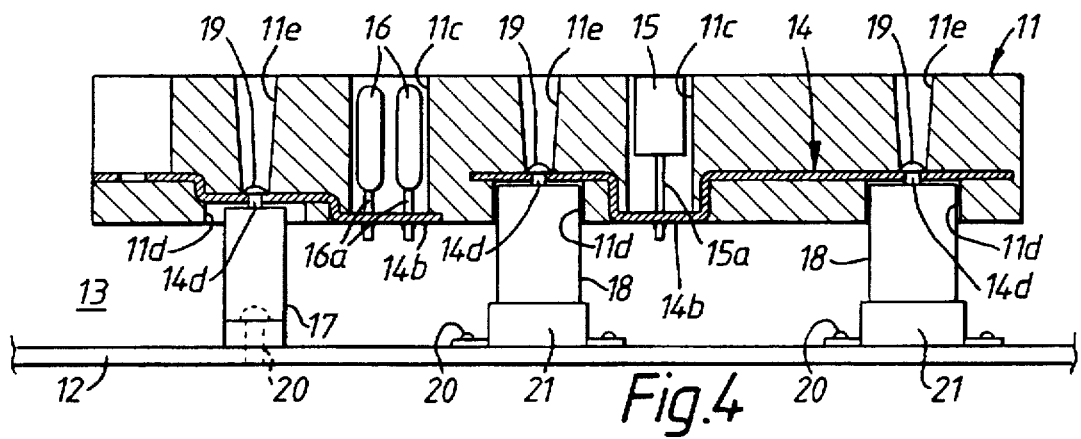
FIG. 4 is a cross-section of a second embodiment of this invention.

The following is a description of a second embodiment of this invention based on FIG. 4. The same symbols have been assigned to members which are the same as in the first embodiment, and their descriptions have been omitted. The following is a description only of those members which are different. The positions of second connecting holes 14d of wiring structure 14 are vertically shifted according to the height dimension difference of rectifier 17 and capacitors 18, so that the lower surfaces of rectifier 17 and capacitors 18 are in the same plane. Furthermore, supporting legs 11b of molded body 11 are eliminated.

The height positions of these second connecting holes 14d are adjusted based on alteration of the bending positions of wiring members 14a. The underside of rectifier 17 is secured to device main body 12 by tightening screws 20, which are equivalent to "securing members", into device main body 12. Also, the undersides of capacitors 18 are secured to device main body 12 via mounts 21, which are equivalent to "securing members", by tightening screws 20 into device main body 12.

When using the above embodiment, the positions of second connecting holes 14d are adjusted according to the difference of height dimensions of rectifier 17 and capacitors 18. The undersides of rectifier 17 and capacitors 18 are secured to the stable surface (the flat portion) of device main body 12. For this reason, both the top and bottom sides of rectifier 17 and capacitors 18 are stably supported, respectively.

Therefore, despite the fact that rectifier 17 and capacitors 16 are large and heavy, even if external forces, such as vibration or shocks, act on device main body 12, no stresses such as vibration will act on the connecting parts between rectifier 17 and second connecting holes 14d or on the connecting parts between capacitors 18 and second connecting holes 14d. As a result, the connecting parts of rectifier 17 and the connecting parts of large capacity capacitors 18 are protected. Therefore, the reliability of the whole device is improved. Moreover, as molded body 11 is supported by rectifier 17 and capacitors 18, there is also the advantage that supporting legs 11b of molded body 11 can be eliminated.

Figure 5:
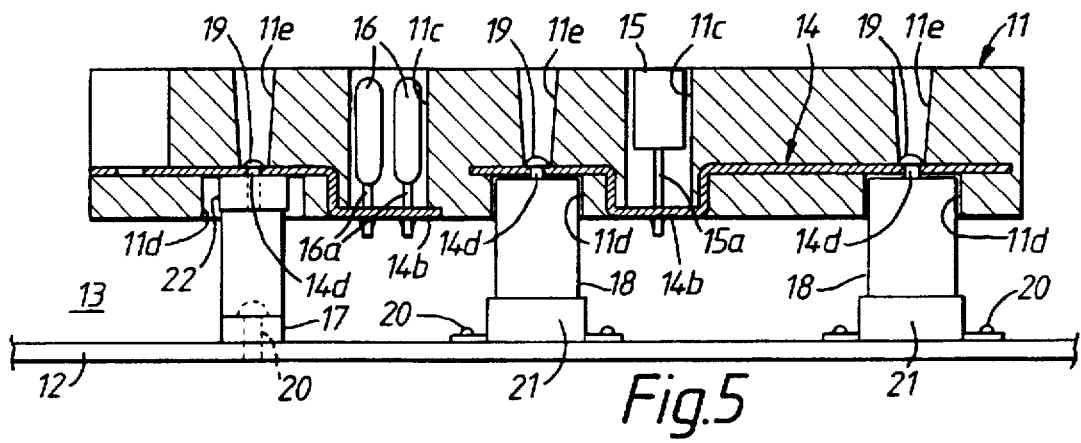
FIG. 5 is a cross-section of a third embodiment of this invention.

The following is a description of a third embodiment of this invention based on FIG. 5. The same symbols have been assigned to members which are the same as in the first embodiment, and their descriptions have been omitted. The following is a description only of those members which are different. A cylindrical collar 22 is brazed on wiring structure 14 in the position of the left-hand second connecting hole 14d. Collar 22 is equivalent to a "tubular member", and is formed of conductive metal. Screw 19 is tightened from second connecting hole 14d into rectifier 17 through collar 22. By this means, rectifier 17 is connected to wiring structure 14.

Contrary to the second embodiment, in this embodiment second connecting holes 14d are formed in wiring structure 14 and are arranged in the same horizontal plane.

The lower side of rectifier 17 and the lower sides of capacitors 18 are on the same plane. This is achieved by adjusting the height dimension of collar 22 according to the difference in the height dimensions of rectifier 17 and capacitors 18. The underside of rectifier 17 is secured to device main body 12 by tightening screws 20 into device main body 12. Also, the undersides of capacitors 18 are secured to device main body 12 via mounts 21 by tightening screws 20 into device main body 12. Collar 22 is insert-molded in molded body 11 in the state of having been brazed to wiring structure 14. Furthermore, supporting legs 11b of molded body 11 are eliminated.

When using the above embodiment, the height dimension of collar 22 is adjusted according to the difference in the height dimensions of rectifier 17 and capacitors 18. Thus the undersides of rectifier 17 and capacitors 18 are secured on the stable surface of device main body 12. For this reason, in the same way as in the second embodiment, the effects can be expected that the connecting portions of rectifier 17 and the connecting portions of capacitors 18 can be protected, and that supporting legs 11b which support molded body 11 can be eliminated. Moreover, as heat generated from rectifier 17 is dissipated from collar 22, wiring structure 14 is protected from the heat generated from rectifier 17. Therefore, the reliability of the system is improved from this point of view as well.

In the above third embodiment, collar 22 is brazed to wiring structure 14. However, this invention is not restricted to this embodiment, and, for example, collar 22 may be caulked to wiring structure 14.

Also, in the second and third embodiments above, the undersides of rectifier 17 and capacitors 18 are made to be in the same plane. However, this invention is not limited to these embodiments. For instance, rectifier 17 and capacitors 18 may be slightly displaced in the vertical direction. In this case, rectifier 17 and capacitors 18 are secured to device main body 12 by absorbing this amount of displacement by adjusting the height dimension of mounts 21.

Also, in the second and third embodiments above, rectifier 17 and capacitors 18 are secured to device main body 12 with screws 20. However, this invention is not restricted to these embodiments. For instance, riveting may be used instead of using screws 20.

Furthermore, in the second and third embodiments above, rectifier 17 is directly secured to device main body 12. However, this invention is not limited to these embodiments. Rectifier 17 may be secured via a mount in the same way as for capacitors 18.

The following is a description of a fourth embodiment of this invention based on FIG. 6 and FIG. 7. The same symbols have been assigned to members which are the same as in the first embodiment, and their descriptions have been omitted. The following is a description only of those members which are different. First, in FIG. 6, a current detector 23, which is equivalent to an "electrical part" is buried in molded body 11. In this case, a mounting hole and screw insertion holes are formed in current detector 23. Screws 23a are inserted into the screw insertion holes.

Current detector 23 is connected and secured to wiring structure 14 by inserting wiring structure 14 into its mounting hole and tightening screws 23a into wiring structure 14. Also, as shown in FIG. 7, an opening 11f is formed in the top of molded body 11, and connectors 23b (for power and for signal fetching) of current detector 23 are exposed on the upper side of molded body 11 through opening 11f.

According to the above embodiment, when manufacturing the circuit board, first, wiring structure 14 is inserted into the mounting hole of current detector 23. Then, screws 23a of current detector 23 are tightened into wiring structure 14. Next, molded body 11 is formed by housing wiring structure 14 in the cavity of a mold. Therefore, current detector 23 can be connected to wiring structure 14 in a state in which current detector 23 is integrated into molded body 11, without performing the after-processing of soldering work and screw-tightening work. For this reason, the connecting work and securing work for current detector 23 can be simplified.

Also, when measuring the current flowing in wiring structure 14, the only work required is the connection of a pair of connectors (not illustrated) to connectors 23b of current detector 23. Therefore, there is no requirement for the connection of a separate conductive material to wiring structure 14 and the connection of the current detector to this conductive material. As a result, the whole circuit can be miniaturized.

The following is a description of a fifth embodiment of this invention based on FIG. 8. The same symbols have been assigned to members which are the same as in the first embodiment, and their descriptions have been omitted. The following is a description only of those members which are different. A plate-shaped circuit pattern former unit 11g is integrated into the center part of molded body 11 in the height direction, and circuit patterns 24 are formed on circuit pattern former unit 11g. Circuit patterns 24 form small current circuits such as signal paths. Electrical parts for surface mounting, such as a transistor 25a, a resistor 25b and a capacitor 25c, are mounted on circuit patterns 24.

When using the above embodiment, circuit patterns 24 are formed in molded body 11. Large current circuits are composed of wiring structure 14 and small current circuits, such as signal paths, are composed of circuit patterns 24. For this reason, reduction of the number of boards and miniaturization of the whole circuit board can be achieved in this embodiment, compared with the case of the separate formation of small current circuits in the printed wiring board.

Figure 9:
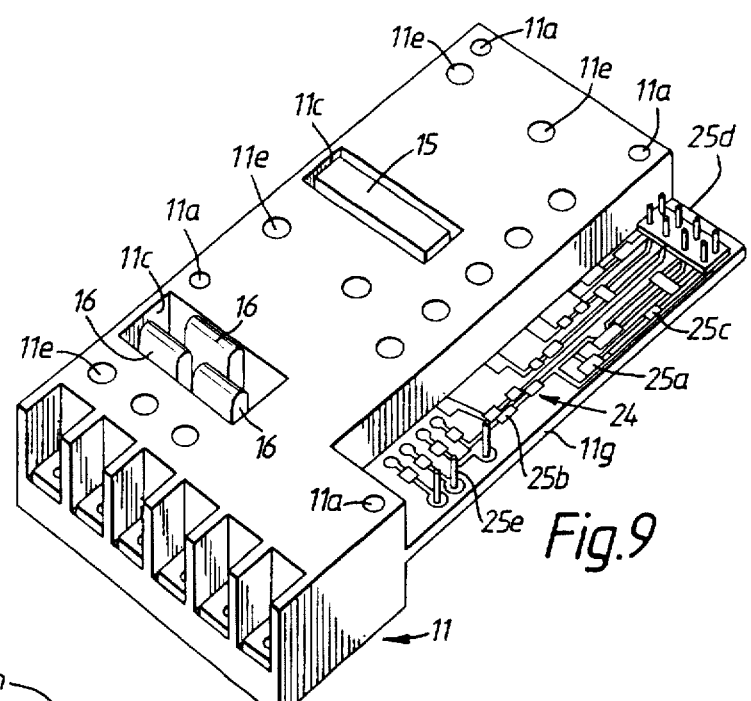
FIG. 9 is an oblique view showing a sixth embodiment of this invention.

The following is a description of a sixth embodiment of this invention based on FIG. 9. The same symbols have been assigned to members which are the same as in the fifth embodiment, and their descriptions have been omitted. The following is a description only of those members which are different. Connectors 25d and 25e, which are equivalent to "lead parts", are mounted in circuit patterns 24. Connectors 25d and 25e are soldered to circuit patterns 24 in a state in which the bases of their terminals are inserted in molded body 11, with the result that their strengths against external forces such as vibration become greater. Surface mounting parts with comparatively small strengths against external forces such as vibration are connected to connectors 25d and 25e.

When using the above embodiment, connectors 25d and 25e with large strengths against external forces are mounted in circuit patterns 24. Surface mounting parts with small strengths against external forces are connected to connectors 25d and 25e. For this reason, the connection strengths of surface mounting parts with small strengths against external forces are improved compared with the case of the direct soldering of such surface mounting parts to circuit pattern 24. As a result, the reliability of the whole small current circuits in regard to the connection of electrical parts is improved.

Figure 10:
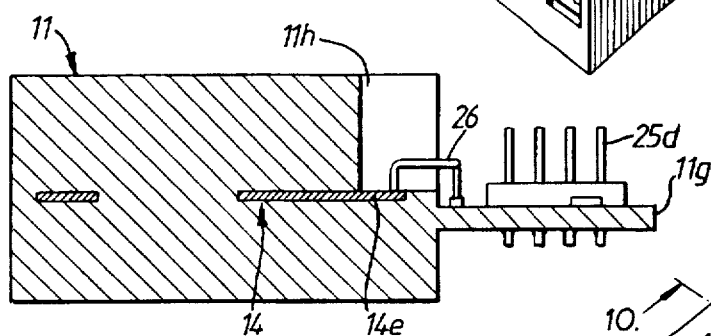
FIG. 10 is a cross-section of a seventh embodiment of this invention along the line B—B in FIG. 11.
Figure 11:
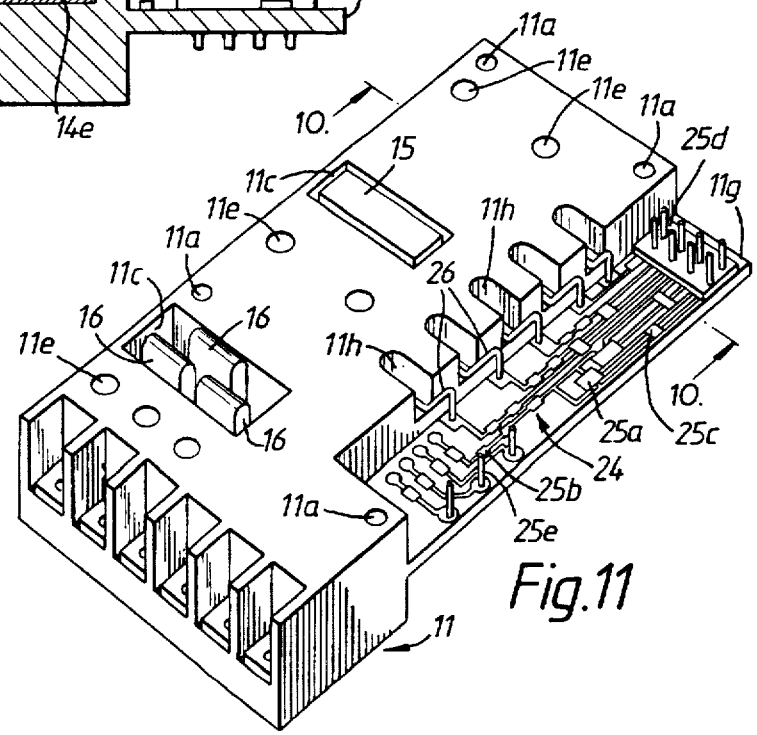
FIG. 11 is an oblique view showing a seventh embodiment of this invention.

The following is a description of a seventh embodiment of this invention based on FIG. 10 and FIG. 11. The same symbols have been assigned to members which are the same as in the sixth embodiment, and their descriptions have been omitted. The following is a description only of those members which are different. First, in FIG. 11, multiple openings 11h are formed in molded body 11, positioned on the side of its circuit patterns 24. Parts of wiring structure 14 are respectively exposed outside molded body 11 through openings 11h.

As shown in FIG. 10, a circuit pattern connecting part 14e is formed in wiring structure 14. Circuit pattern connecting part 14e is positioned in the center of molded body 11 in its height direction. One end of a connector member 26 is soldered to circuit pattern connecting part 14e. Connector member 26 is formed by bending a conductive material into a U shape. The other end of connecting member 26 is soldered to circuit pattern 24 after being inserted into circuit pattern former unit 11g.

When using the above embodiment, the fetching of the states of the current flowing in wiring structure 14 and the voltage of wiring structure 14 as signals and the feeding of these fetched signals to circuit patterns 24 are performed by connector member 26. Then, the signals from wiring structure 14 can be processed in circuit patterns 24. Therefore, there is no requirement for connecting various parts for signal detection to wiring structure 14. As a result, the miniaturization of the circuit board and the simplification of its composition can be achieved. Furthermore, as the transmission distance (the length dimension of connector member 26) of signals fetched from wiring structure 14 is short, increased resistance to noise related to signal processing can be designed.

Also, circuit pattern connecting part 14e and circuit pattern former unit 11g are arranged in the same plane. For this reason, the work of soldering connector member 26 to circuit pattern connecting part 14e and circuit pattern former unit 11g and the work of soldering electrical parts to circuit patterns 24 can be performed simultaneously with the use of a solder bath for peinted wiring boards.

Figure 12:
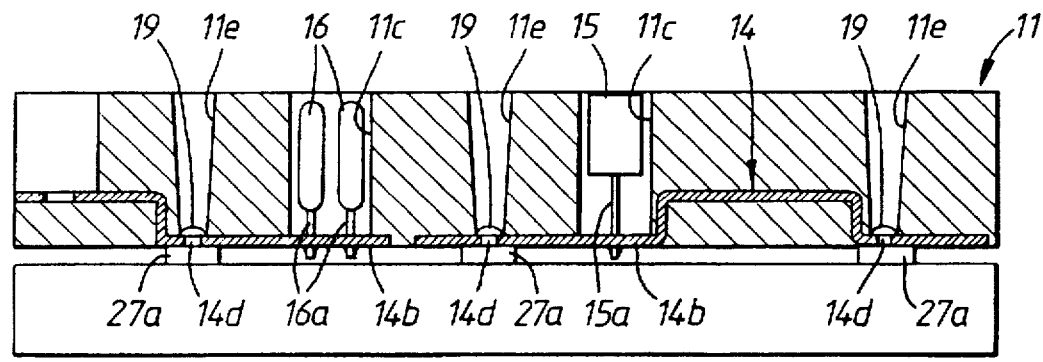
FIG. 12 is a cross-section of an eighth embodiment of this invention along the line A—A in FIG. 13.
Figure 13:
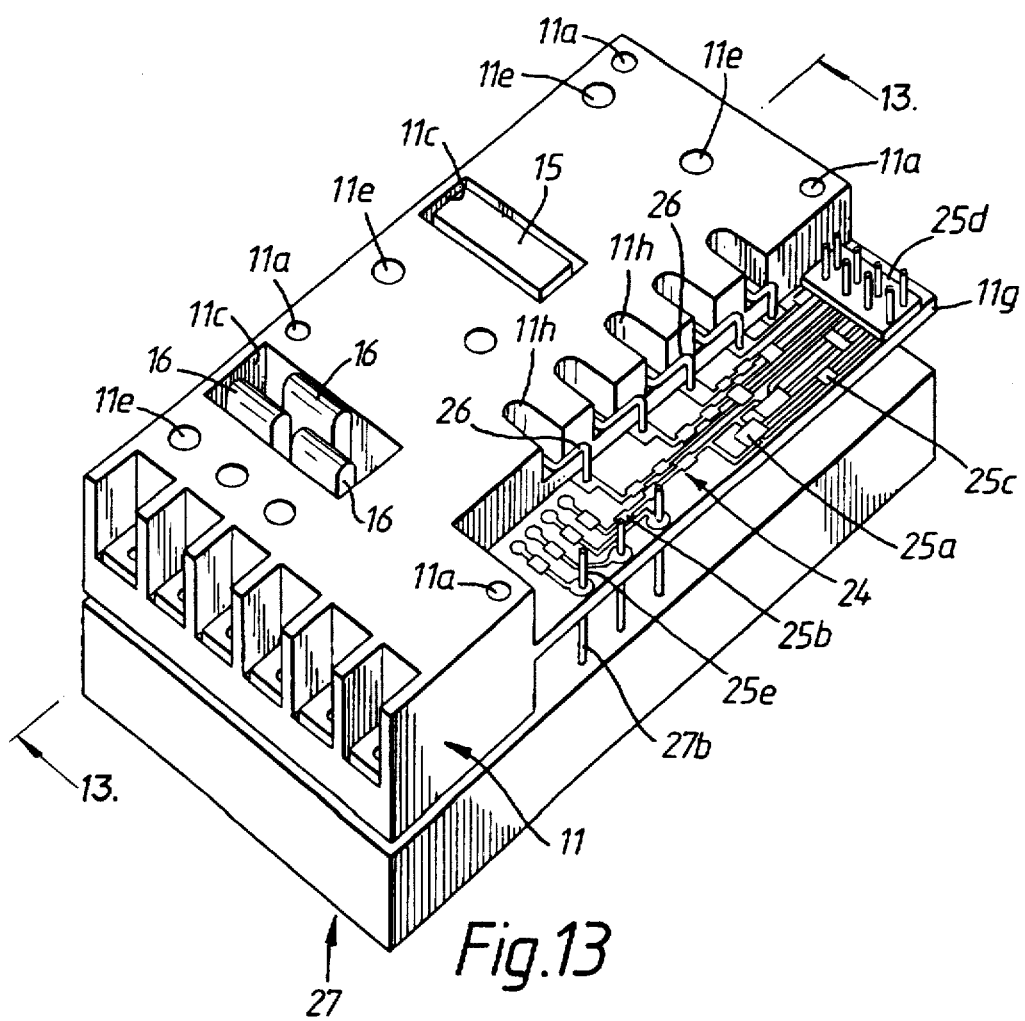
FIG. 13 is an oblique view showing an eighth embodiment of this invention.

The following is a description of an eighth embodiment of this invention based on FIG. 12 and FIG. 13. The same symbols have been assigned to members which are the same as in the seventh embodiment, and their descriptions have been omitted. The following is a description only of those members which are different. First, in FIG. 12, respective second connecting holes 14d are formed in connecting parts 14b of wiring structure 14. By this means, multiple second connecting holes 14d are positioned along the underside of wiring structure 14 and are exposed on the underside of molded body 11.

Screws 19 are inserted into second connecting holes 14d through openings 11e of molded body 11, respectively. Screws 19 are respectively tightened into a semiconductor device 27 through electrodes 27a of semiconductor device 27, which is equivalent to an "electrical part". By this means, each electrode 27a of semiconductor device 27 is connected to wiring structure 14. Also, as shown is FIG. 13, a gate pin 27b of semiconductor device 27 is thrust through circuit pattern former unit 11g from bottom to top to be soldered to circuit pattern 24.

However, when connecting an electrical part, such as semiconductor device 27, of about the same size as molded body 11 to wiring structure 14, opening 11d for insertion of the electrical part cannot be formed in molded body 11. In this regard, with this embodiment, as second connecting holes 14d are arranged on the underside of molded body 11, even if the electrical part is of about the same size as molded body 11, it can be connected to wiring structure 14.

Moreover, the connecting parts between second connecting holes 14d and semiconductor device 27 are exposed, so that it is possible to visually check the connecting parts from outside. As a result, reliability of the system is improved.

Also, a gap equivalent to the length of each of electrodes 27a can be formed between the underside of molded body 11 and the surface of semiconductor device 27. Therefore, terminal 15a of resistor 15 and terminals 16a of capacitors 16 are prevented from making contact with the surface of semiconductor device 27. For this reason, terminal 15a and terminals 16a do not obstruct the work of screwing on semiconductor device 27 by getting in the way. As a result, poor contact with semiconductor device 27 can be prevented. At the same time, terminals 15a and 16a are prevented from scratching the surface of semiconductor devise 27.

Figure 14:
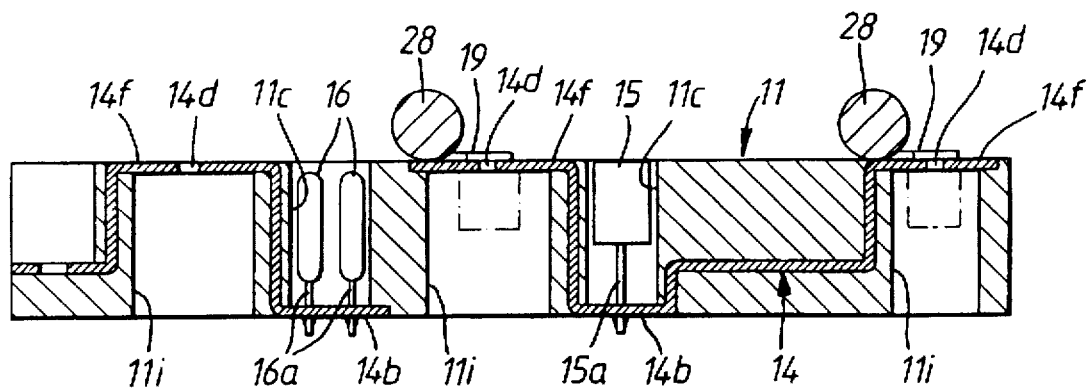
FIG. 14 is a cross-section of a ninth embodiment of this invention along the line A—A in FIG. 15.
Figure 15:
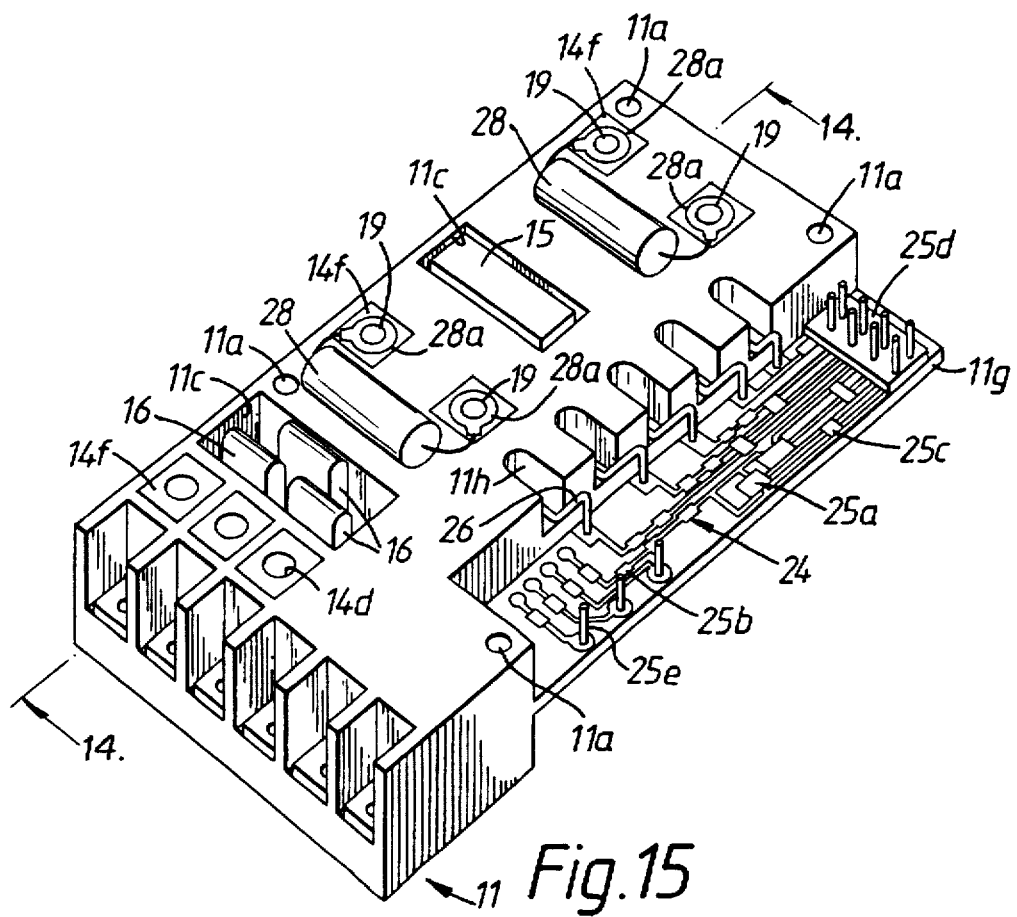
FIG. 15 is an oblique view showing a ninth embodiment of this invention.

The following is a description of a ninth embodiment of this invention based on FIG. 14 and FIG. 15. The same symbols have been assigned to members which are the same as in the seventh embodiment, and their descriptions have been omitted. The following is a description only of those members which are different. First, in FIG. 14, multiple connecting parts 14f which protrude upwards are formed in wiring structure 14. Connecting parts 14f are positioned along the uppermost surface of molded body 11 and are thus exposed on the upper side of molded body 11. Second connecting hole 14d is formed in each connecting part 14f.

As shown in FIG. 15, both terminals 28a of each of capacitors 2.8, which is equivalent to an "electrical part", are placed on connecting parts 14f of wiring structure 14. As shown is FIG. 14, screws 19 are respectively inserted into both terminals 28a and second connecting holes 14d. Also, multiple openings 11i are formed in molded body 11. Connecting parts 14f of wiring structure 14 are exposed on the underside of molded body 11 through openings 11i. Then separate electrical parts (shown by the 2-dot chain lines) are respectively inserted in openings 11i. Screws 19 inserted in terminals 28a and second connecting holes 14d are respectively tightened into the electrical parts in openings 11i. By this means, capacitors 28 and the electrical parts in openings 11i are tightened together and are connected to wiring structure 14, respectively.

When using the above embodiment, second connecting holes 14d are arranged along the upper surface of molded body 11. Thus, it is possible to insert separate electrical parts into openings 11i and to tighten these electrical parts and capacitors 28 together, respectively. Therefore, the mounting density of electrical parts is improved, and the circuit board can be miniaturized. Moreover, the work of tightening screws 19 can be performed from the upper surface of molded body 11. Therefore, the tightening work on screws 19 can be simply performed in an operation on the plane without turning molded body 11 upside down or taking unnatural working postures.

In the above ninth embodiment, both terminals of each of capacitors 28 are screwed to second connecting holes 14d. However, this invention is not restricted to this embodiment. One terminal of each of capacitor 28 may be screwed to second connecting hole 14d, the other terminal may be soldered to circuit pattern 24. In the case of this composition, capacitors 28 function as the connecting members, with the result that signals from wiring structure 14 can be fetched to circuit patterns 24 through capacitors 28.

In the above eighth embodiment, second connecting holes 14d are arranged on the underside of molded body 11, and in the above ninth embodiment they are arrenged on the upper surface of molded body 11. However, this invention is not limited to these embodiments. Second connecting holes 14d may be arranged on the sides of molded body 11. In other words, they may be arranged on any surface of molded body 11

Figure 16:
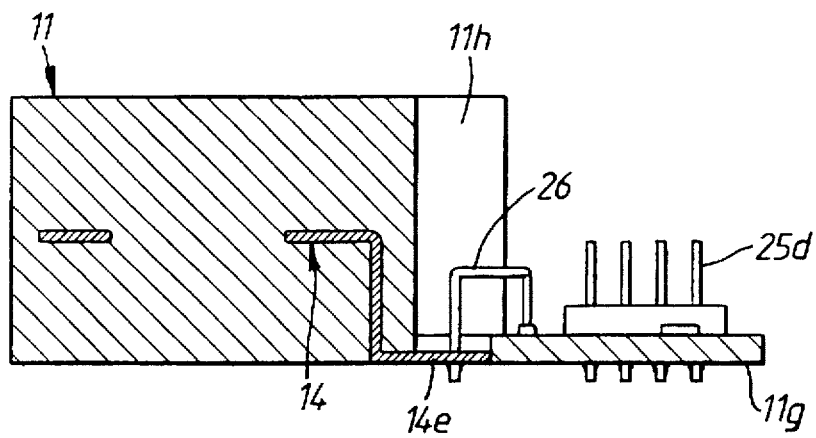
FIG. 16 is a cross-section of a tenth embodiment of this invention along the line B—B in FIG. 17.
Figure 17:
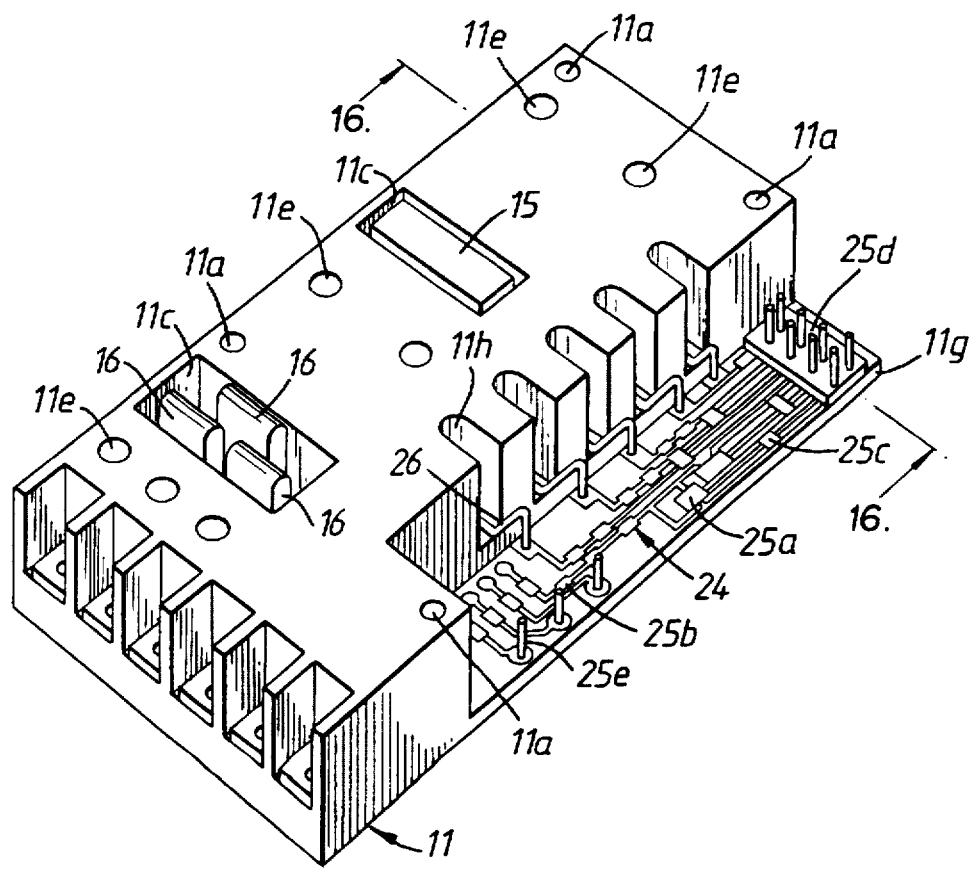
FIG. 17 is an oblique view showing a tenth embodiment of this invention.

The following is a description of a tenth embodiment of this invention based on FIG. 16 and FIG. 17. The same symbols have been assigned to members which are the same as in the seventh embodiment, and their descriptions have been omitted. The following is a description only of those members which are different. Circuit pattern connecting parts 14e are arranged on the underside of molded body 11. Their upper surfaces are exposed to the upper side of molded body 11 through openings 11h, and their undersides are exposed on the underside of molded body 11. Also, circuit pattern former unit 11g is arranged on the underside of molded body 11. Thus, circuit pattern former unit 11g, multiple connecting parts 14b and circuit pattern connecting parts 14e are positioned in the same plane.

When using the above embodiment, circuit patterns 24 of circuit pattern former unit 11g, circuit pattern connecting parts 14e and multiple connecting parts 14b are positioned in the same plane. For this reason, the work of soldering electrical parts to multiple connecting parts 14b, the work of soldering connecting members 26 to circuit pattern connecting parts 14e and circuit patterns 24 and the work of soldering electrical parts for small current circuit use to circuit patterns 24 can all be performed at the same time with the use of a solder bath for printed wiring boards. As a result, the workability of connecting electrical parts is significantly improved.

Figure 18:
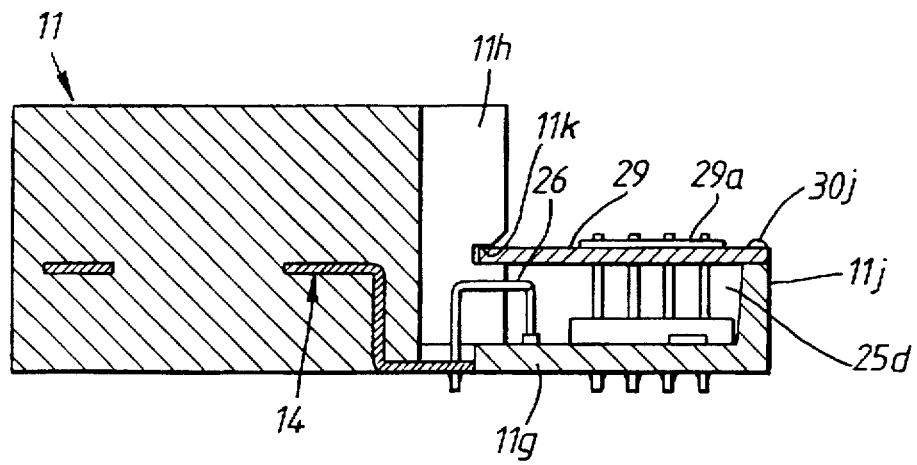
FIG. 18 is a cross-section of an eleventh embodiment of this invention along the line B—B in FIG. 19.
Figure 19:
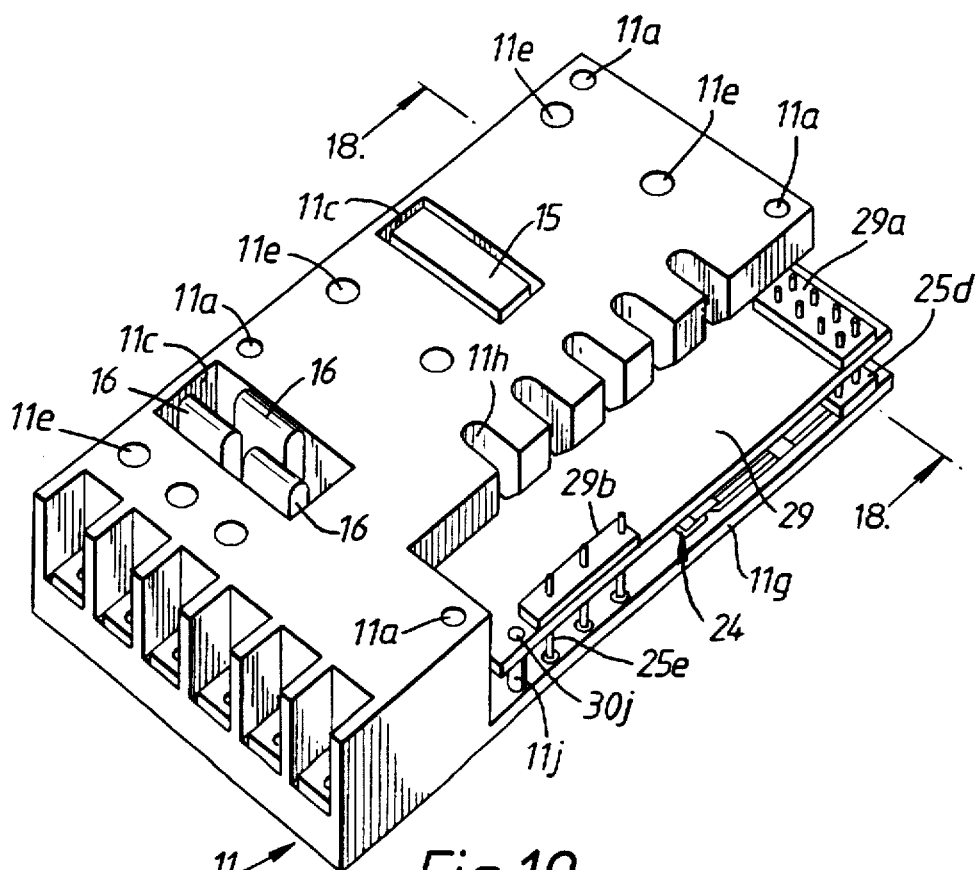
FIG. 19 is an oblique view showing an eleventh embodiment of this invention.

The following is a description of an eleventh embodiment of this invention based on FIG. 18 and FIG. 19. The same symbols have been assigned to members which are the same as in the tenth embodiment, and their descriptions have been omitted. The following is a description only of those members which are different. First, in FIG. 19, a printed wiring board 29 is provided above circuit pattern former unit 11g. Small current circuits such as signal paths or rather large current circuits of smaller capacity than that of wiring structure 14 are formed on printed wiring board 29. Then, connectors 29a and 29b are mounted on printed wiring board 29. These connectors 29a and 29b are respectively connected to connectors 25d and 25e of circuit patterns 24. By this means, the circuit patterns of printed wiring board 29 are connected to circuit patterns 24.

As shown in FIG. 18, multiple supporting units 11j, equivalent to "board fitting units", are incorporated with circuit pattern former unit 11g. Printed wiring board 29 is supported by supporting units 11j. Also, self-tapping screws 30j are tightened into printed circuit board 29 and supporting units 11j from above, respectively. Thus, printed wiring board 29 is secured to supporting units 11j with self-tapping screws 30. Also, a groove 11k, equivalent to a "board fitting unit" is incorporated in the side of molded body 11. Printed wiring board 29 is prevented from tilting by its insertion into groove 11k.

When using the above embodiment, supporting units 11j and groove 11k are formed in molded body 11. Then, printed wiring board 29 is fitted to supporting units 11j and groove 11k. Therefore, circuits which cannot be formed on wiring structure 14 or circuit patterns 24 for reasons of space and cost can be formed on printed wiring board 29 and can be mounted in the system. For this reason, versatile functions can be added to the device in a small space while preventing the system from becoming bulky. Also, printed wiring board 29 can be fitted to molded body 11 without using members other than self-tapping screws 30j. Thus, simplification of composition and reduction of cost can be achieved in this embodiment.

In the above eleventh embodiment, supporting units 11j and groove 11k have been given as examples of board fitting units. However, this invention is not restricted to this embodiment. For instance, claw-shaped board fitting units may be incorporated in molded body 11, holes may be formed in printed wiring board 29, and the composition may be by hooking the claw-shaped board fitting units into the holes in printed wiring board 29, respectively.

Also, in the above eleventh embodiment, a composition is used in which printed wiring board 29 is connected to circuit patterns 24. However, this invention is not restricted to this embodiment. A composition which connects printed wiring board 29 to wiring structure 14 may also be used.

Figure 20:
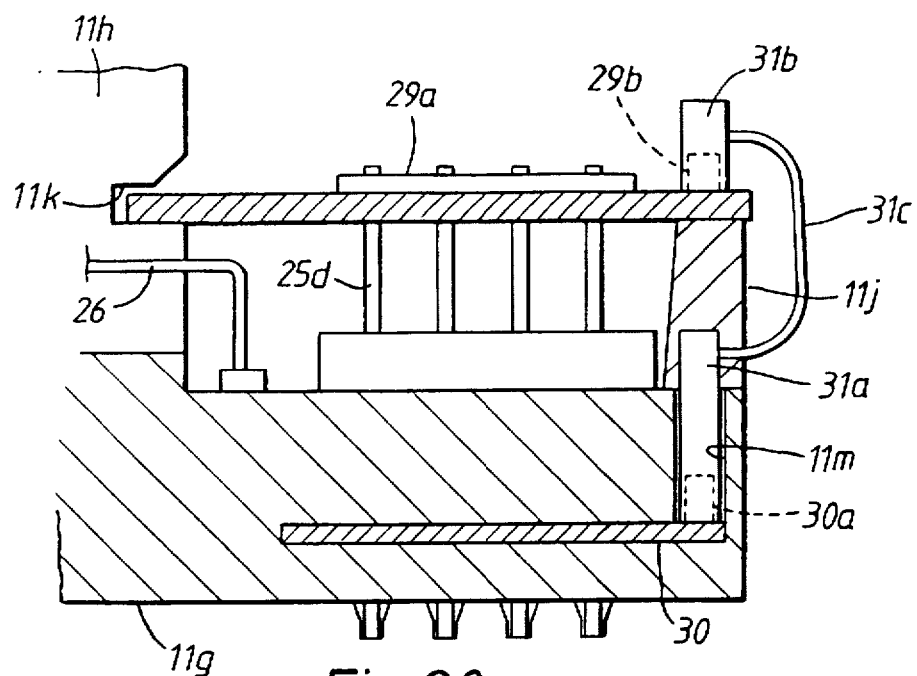
FIG. 20 is a cross-section of a twelfth embodiment of this invention along the line B—B in FIG. 21.
Figure 21:
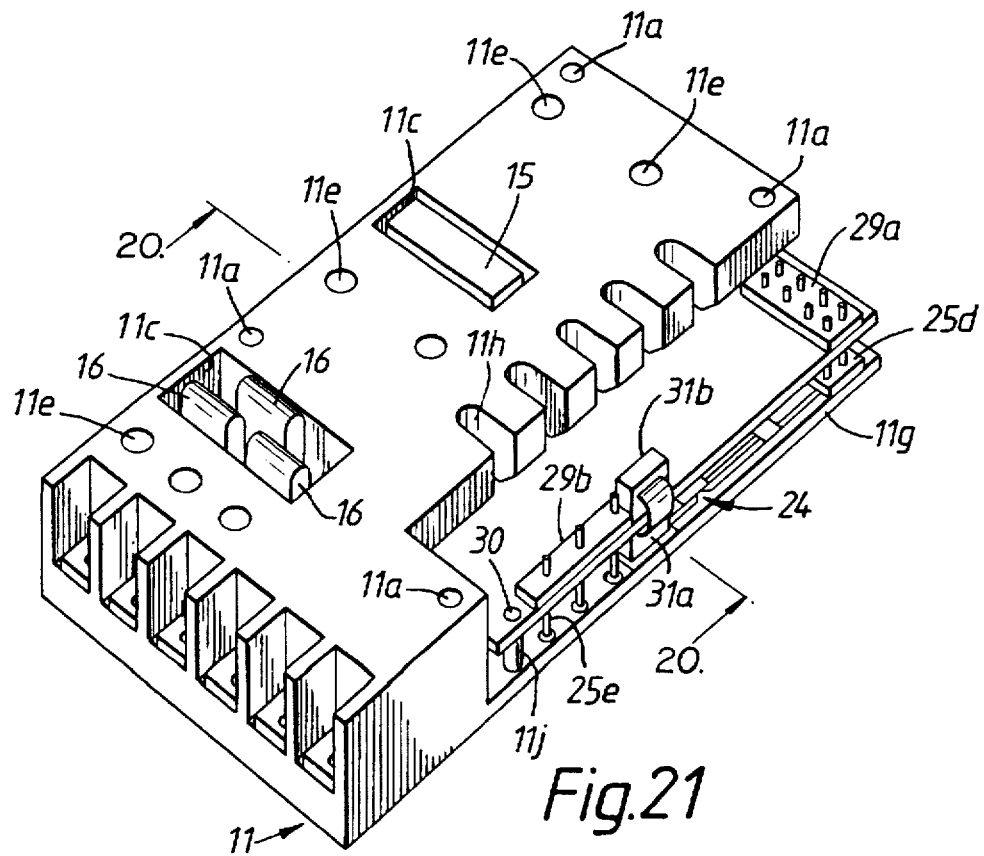
FIG. 21 is an oblique view showing a twelfth embodiment of this invention.

The following is a description of a twelfth embodiment of this invention based on FIG. 20 and FIG. 21. The same symbols have been assigned to members which are the same as in the eleventh embodiment, and their descriptions have been omitted. The following is a description only of those members which are different. Circuit pattern former unit 11g is thickly formed, and a printed wiring board 30 is buried in circuit pattern former unit 11g. Printed wiring board 30 is housed in the mold in a state in which surface mounting parts such as connector 30a are already mounted thereon. By this means, printed wiring board 30 is insert-molded in molded body 11.

An opening 11m is formed in circuit pattern former unit 11g. A connector 30a of printed wiring board 30 is exposed to the upper surface of circuit pattern former unit 11g through opening 11m. Then, a connector 31a is connected to connector 30a of printed wiring board 30 through opening 11m. Also, a connector 31b is connected to connector 31a via a cable 31c. Connector 31b is connected to connector 29b of printed wiring board 29. Therefore, printed wiring board 30 is connected to wiring structure 14 via printed wiring board 29 and circuit patterns 24.

When using the above embodiment, printed wiring board 30 is buried in molded body 11. Therefore, circuits which cannot be formed in wiring structure 14, circuit patterns 24 or printed wiring board 29 for reasons of space and cost can be formed on printed wiring board 30 and mounted in the system. For this reason, even more versatile functions can be added in a small space while preventing the system from becoming bulky.

In the above twelfth embodiment, a composition of connecting printed wiring board 30 to printed wiring board 29 is used. However, this invention is not limited to this embodiment. Printed wiring board 30 may be connected to circuit pattern 24 or wiring structure 14, instead. In particular, in the case of printed wiring board 30 being connected to wiring structure 14, these may be insert molded by housing these in the mold in a pre-connected state.

Figure 22:
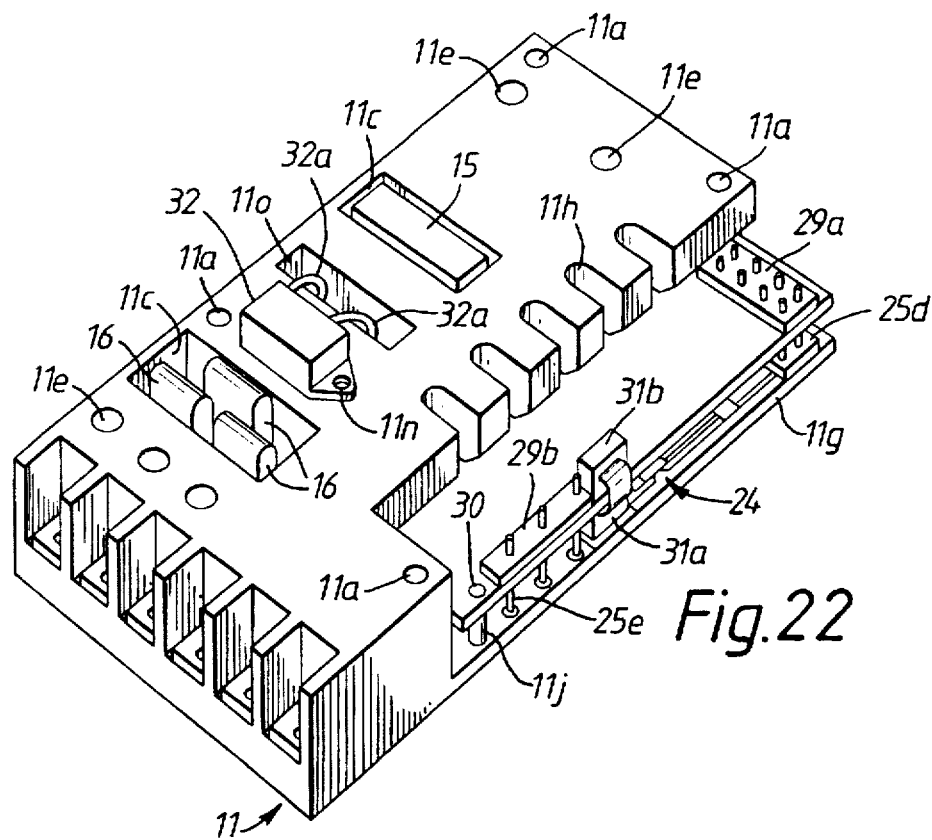
FIG. 22 is an oblique view showing a thirteenth embodiment of this invention.
Figure 23:
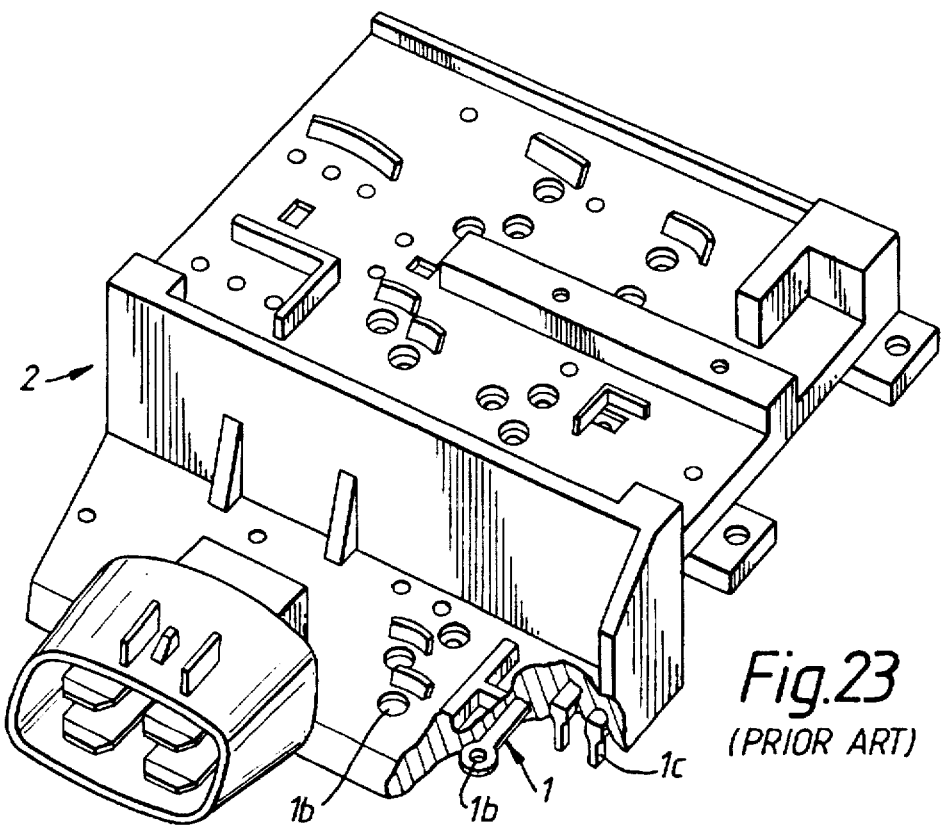
FIG. 23 is an oblique view showing a conventional circuit board.
Figure 24:
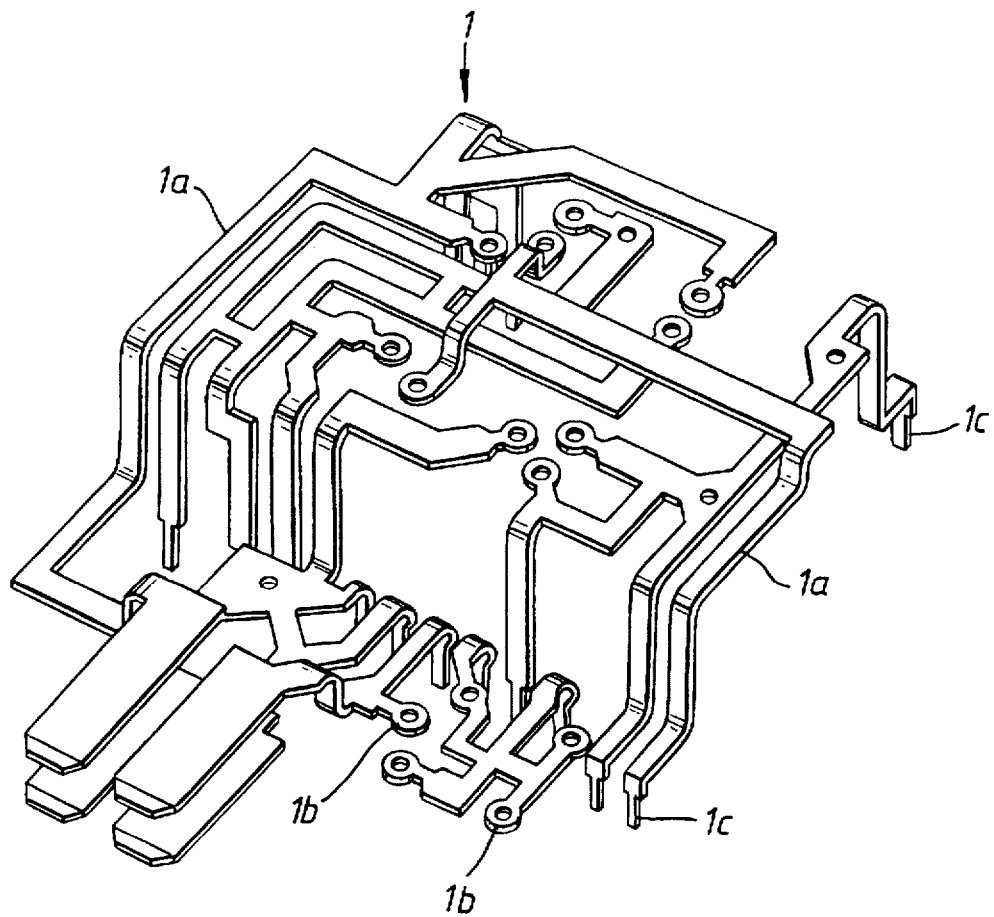
FIG. 24 is an oblique view showing a conventional wiring structure in a circuit board shown in FIG. 23.

The following is a description of a thirteenth embodiment of this invention based on FIG. 22. The same symbols have been assigned to members which are the same as in the twelfth embodiment, and their descriptions have been omitted. The following is a description only of those members which are different. A mounting hole 11n, which is equivalent to a "part fitting unit" is formed on the upper surface of molded body 11.

A snubber circuit part 32, equivalent to an "electrical part" is fitted on the upper surface of molded body 11. Snubber circuit part 32 is secured to molded body 11 with the tightening of a self-tapping screw (not illustrated) into mounting hole 11n of molded body 11. Also, an opening 11o is formed in molded body 11. Connecting parts 14b of wiring structure 14 are exposed to the upper side of molded body 11 through opening 11o. Then, wires 32a and 32a, which are the electrode parts of snubber circuit part 32, are soldered to connecting parts 14b through opening 11o.

When using the above embodiment, mounting hole 11n is formed in molded body 11, and snubber circuit part 32 is secured by mounting hole 11n. For this reason, there is no requirement to add any special member for securing snubber circuit part 32. The mounting of snubber circuit part 32 becomes simple with a very small number of parts, such as one self-tapping screw. As a result, miniaturization of the system and reduction of cost can be achieved. Also, as the electrode parts of snubber circuit part 32 are composed of wires 32a, snubber circuit part 32 cannot be supported by its electrode parts. In this embodiment, snubber circuit part 32 is supported by molded body 11. Thus, no stress acts on wires 32a, and the reliability of the system as a whole is improved.

In the above thirteenth embodiment, mounting hole 11n is given as an example of a "part fitting unit". However, this invention is not restricted to this embodiment. For instance, the part fitting unit may be composed of two claws which face each other. In the case of this composition, snubber circuit 32 is fitted to molded body 11 by pushing it in between the two claws.

Also, in the above first to thirteenth embodiments, screws 19 are given as examples of "fastening members". However, this invention is not limited to these embodiments. For instance, rivets may also be used instead of screws 19.

Moreover, in the above first to thirteenth embodiments, multiple connecting parts 14b are positioned along the underside of molded body 11. However, this invention is not limited to these embodiments. They may be on the upper surface or on the side surface, of molded body, instead of the underside of molded body 11.

Furthermore, in the above first to thirteenth embodiments, second connecting holes 14d are formed as hole shapes. However, this invention is not limited to these embodiments. For instance they may also be formed as tapped hole shapes, instead.

As is clear from the above descriptions, the circuit board and the circuit board assembly of this invention exhibit the following effects. Electrical parts can be soldered simultaneously to multiple connecting parts by using a solder bath for printed wiring boards. Moreover, electrical parts can be connected by the automatic insertion of their fastening members into the connecting holes. For this reason, the work of connecting electrical parts can be fully automated, thus improving the workability of connection work.

Obviously, numerous modifications and variations of the present invention are possible in light of the above teachings. It is therefore to be understood that within the scope of the appended claims, the invention may be practiced otherwise than as specifically described herein.

What is claimed is:

1. A circuit board, comprising:
   a resin layer; and
   a wiring structure buried in said resin layer for forming an electric circuit;
   said wiring structure being provided with a connecting part for soldering a first electrical part;
   said wiring structure being provided with a connecting hole for connecting a second electrical part by inserting a fastening member; and said connecting part being positioned on a surface of said resin layer.

2. The circuit board according to claim 1, wherein:

said wiring structure is composed of a plurality of wiring members assembled three-dimensionally;

a plurality of said wiring members forms said electric circuit;

said wiring structure is provided with a plurality of said connecting parts formed in said wiring members;

each of said connecting parts is provided for soldering one of said first electrical parts, respectively;

said wiring structure is provided with a plurality of said connecting holes formed in said wiring members;

each of said connecting holes is provided for connecting one of said second electrical parts by inserting one of said fastening members, respectively; and a plurality of said connecting parts are positioned on said surface of said resin layer.

3. The circuit board according to claim 2, wherein:

said wiring structure is provided with a plurality of said connecting holes for connecting a plurality of said second electrical parts with different height dimensions, respectively; and height positions of said connecting holes are respectively displaced according to said height dimensions of said second electrical parts.

4. The circuit board according to claim 2, further comprising:

a circuit pattern former unit in said resin layer on which a circuit pattern is provided.

5. The circuit board according to claim 2, further comprising:

a circuit pattern former unit in said resin layer on which a circuit pattern is provided; and a connection member;

wherein:

said wiring structure is provided with a circuit pattern connecting part; and said connection member connects between said circuit pattern connecting part and said circuit pattern.

6. The circuit board according to claim 5, wherein:

said circuit pattern connecting part and said circuit pattern former unit are arranged on a surface part of said resin layer.

7. The circuit board according to claim 2, wherein:

said connecting holes are positioned on an upper surface of said resin layer.

8. The circuit board according to claim 1, wherein:

said wiring structure is composed of a plurality of wiring members assembled three-dimensionally;

a plurality of said wiring members forms said electric circuit;

said wiring structure is provided with a plurality of said connecting parts formed in said wiring members;

each of said connecting parts is provided for soldering one of said first electrical parts, respectively;

said wiring structure is provided with a plurality of said connecting holes formed in said wiring members;

each of said connecting holes are provided for connecting said second electrical part by inserting one of said fastening members, respectively;

a plurality of said connecting parts are positioned on said surface of said resin layer; and said connecting holes are arranged on a surface part of said resin layer.

9. A circuit board assembly, comprising:

a resing layer;

a wiring structure buried in said resin layer composed of a plurality of wiring members assembled three-dimensionally for forming an electric circuit;

a plurality of first electrical parts;

a plurality of second electrical parts; and a plurality of fastening members;

said wiring structure being provided with a plurality of connecting parts formed in said wiring members;

each of said first electrical parts being soldered to one of said connecting parts, respectively;

said wiring structure being provided with a plurality of connecting holes formed in said wiring members;

each of said second electrical parts is connected to one of said wiring members by inserting one of said fastening members in one of said connecting holes, respectively, and said connecting parts being positioned on a surface of said resin layer.

10. The circuit board assembly according to claim 9, further comprising a plurality of securing members, wherein:

height dimensions of said second electrical parts are different;

height positions of said connecting holes are respectively displaced according to said height dimensions of said second electrical parts;

a first terminal of each of said second electrical parts is connected to one of said wiring members by inserting one of said fastening member in one of said connecting holes, respectively; and a second terminal of each of said second electrical parts is adapted for connecting to an outer device by one of said securing members, respectively, such that said second electrical parts at said second terminals are in the same plane.

11. The circuit board assembly according to claim 9, further comprising:

a tubular member connected to said wiring structure at one of said connecting holes; and a plurality of securing members;

wherein:

height dimensions of said second electrical parts are different;

height positions of said connecting holes are in the same plane;

a first terminal of one of said second electrical parts is connected to one of said wiring members by inserting one of said fastening member in one of said connecting holes through said tubular member;

a first terminal of each of the others of said second electrical parts is connected to one of said wiring members by inserting one of said fastening members in one of said connecting holes, respectively; and a second terminal of each of said second electrical parts is adapted for connecting to an outer device by one of said securing members, respectively, such that said second electrical parts at said second terminals are in the same plane.

12. The circuit board assembly according to claim 9, further comprising a third electrical part:

wherein said third electrical part is fitted to said wiring structure and buried in said resin layer together with said wiring structure.

13. The circuit board assembly according to claim 9, further comprising:

a circuit pattern former unit in said resin layer on which a circuit pattern is provided; and an electrical part for surface mounting mounted on said surface pattern.

14. The circuit board assembly according to claim 9, further comprising:

a circuit pattern former unit in said resin layer on which a circuit pattern is provided;

a plurality of lead parts mounted on said circuit pattern former unit such that said lead parts are connected to said circuit pattern; and an electrical part for surface mounting mounted to said lead parts.

15. The circuit board assembly according to claim 9, further comprising:

a circuit pattern former unit in said resin layer on which a first circuit pattern is provided;

a printed wiring board on which a second circuit pattern is provided;

a plurality of connecting parts for connecting between said first circuit pattern and said second circuit pattern;

a plurality of board fitting units incorporated with said circuit pattern former unit for supporting said printed wiring board; and a first connecting member;

wherein said wiring structure is provided with a circuit pattern connecting part, and said first connecting member connects between said circuit pattern connecting part and said first circuit pattern.

16. The circuit board assembly according to claim 15, further comprising:

a printed wiring board buried in said resin layer on which a third circuit pattern is provided;

a second connecting member for connecting between said second circuit pattern and said third circuit pattern.

17. The circuit board assembly according to claim 9, further comprising:

a part fitting unit for fitting an electrical part provided on said resin layer.

18. A circuit board assembly, comprising:

a resin layer;

a wiring structure buried in said resin layer composed of a plurality of wiring members assembled three-dimensionally for forming an electric circuit;

a plurality of first electrical parts;

a second electrical part; and a plurality of fastening members;

said wiring structure being provided with a plurality of connecting parts formed in said wiring members;

each of said first electrical parts being soldered to one of said connecting parts, respectively;

said wiring structure being provided with a plurality of connecting holes formed in said wiring members;

said second electrical part is connected to one of said wiring members by inserting one of said fastening members in one of said connecting holes, respectively, and said connecting parts being positioned on a surface of said resin layer; and said connecting holes are arranged on a surface part of said resin layer.

* * * * *